United States Patent
Choi et al.

(10) Patent No.: US 8,299,597 B2
(45) Date of Patent: Oct. 30, 2012

(54) SEMICONDUCTOR CHIP, WIRING SUBSTRATE OF A SEMICONDUCTOR PACKAGE, SEMICONDUCTOR PACKAGE HAVING THE SEMICONDUCTOR CHIP AND DISPLAY DEVICE HAVING THE SEMICONDUCTOR PACKAGE

(75) Inventors: Yun-Seok Choi, Hwaseong-si (KR); Hee-Seok Lee, Yongin-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 558 days.

(21) Appl. No.: 12/502,324

(22) Filed: Jul. 14, 2009

(65) Prior Publication Data

US 2010/0006869 A1   Jan. 14, 2010

(30) Foreign Application Priority Data

Jul. 14, 2008   (KR) .................. 10-2008-0067866

(51) Int. Cl.
*H01L 23/48* (2006.01)

(52) U.S. Cl. ............ 257/690; 257/773; 257/E23.01; 257/E23.141

(58) Field of Classification Search .......... 257/88, 257/690, 773, E33.066, E23.01, E23.141; 174/261
See application file for complete search history.

(56) References Cited

U.S. PATENT DOCUMENTS

2007/0138654 A1 * 6/2007 Kim .............. 257/786
2009/0114914 A1 * 5/2009 Lin .............. 257/48

FOREIGN PATENT DOCUMENTS

JP 2006-098495 4/2006
KR 20070075474 7/2007

* cited by examiner

*Primary Examiner* — Lex Malsawma
(74) *Attorney, Agent, or Firm* — Stanzione & Kim, LLP

(57) ABSTRACT

A semiconductor chip can include a semiconductor substrate, an input portion and an output portion. A circuit element can be formed in the semiconductor substrate. The input portion can be formed on the semiconductor substrate. The input portion can include a first input pad to receive an input signal from the outside and a second input pad spaced apart from the first input pad, the second input pad being electrically connected to the first input pad through an external connection line such that the second input pad inputs the input signal to the circuit element. The output portion can be formed on the semiconductor substrate. The output pad can include an output pad to output an output signal from the circuit element.

23 Claims, 8 Drawing Sheets

SEMICONDUCTOR CHIP, WIRING SUBSTRATE OF A SEMICONDUCTOR PACKAGE, SEMICONDUCTOR PACKAGE HAVING THE SEMICONDUCTOR CHIP AND DISPLAY DEVICE HAVING THE SEMICONDUCTOR PACKAGE

CROSS-REFERENCE TO RELATED APPLICATIONS

This application claims priority under 35 U.S.C. §119 to Korean Patent Application No. 2008-67866, filed on Jul. 14, 2008 in the Korean Intellectual Property Office (KIPO), the contents of which are herein incorporated by reference in their entirety.

BACKGROUND

1. Field of the Invention

Example embodiments of the present general inventive concept relate to a semiconductor chip, a wiring substrate of a semiconductor package, a semiconductor package including the same and a display device including the same. More particularly, example embodiments of the present general inventive concept relate to a semiconductor chip to be mounted on a film substrate, a semiconductor package including the same and a display device including the same.

2. Description of the Related Art

Generally, semiconductor devices are manufactured by a fab process for forming electric circuits including electric elements on a semiconductor substrate such as a silicon wafer, an electrical die sorting (EDS) process for inspecting electrical properties of chips formed by the fab process, and a packaging process for sealing the chips with resin such as epoxy and sorting the chips.

Through the packaging process, the semiconductor device such as a semiconductor chip is electrically connected to a mounting substrate, and the semiconductor chip is sealed to be protected from the outside. The semiconductor package including the semiconductor chip mounted on the mounting substrate dissipates heat from the semiconductor chip outside through cooling functions thereof. For example, methods of electrically connecting the semiconductor chip to the mounting substrate may include a wire bonding process, a solder bonding process, a tape automated bonding (TAB) process, etc.

Nowadays, the manufacturing industry for tape packages, which are used as driver integrated circuit (IC) components for flat-panel displays (FPDs), owes its growth to the development of the manufacturing industry for FPDs, such as liquid crystal displays (LCDs). A tape package is a semiconductor package using a tape substrate. The tape package may be classified as either a tape carrier package (TCP) or a chip-on-film (COF) package.

Generally, input/output (I/O) wiring patterns formed on the tape substrate may be used as external connection terminals in the TAB process. The I/O wiring patterns are directly adhered to a printed circuit board (PCB) or a display panel to manufacture the tape package.

In the semiconductor package such as the tape package, the number of signal lines for inputting/outputting signals to/from the semiconductor chip is being increased. Thus, a size of the tape substrate to mount the semiconductor chip and a line width of the wiring pattern are being reduced.

For example, an input signal such as a power/ground supply signal is inputted to the semiconductor chip through an input wiring and then is applied to a circuit element within the semiconductor chip through a conductive line formed in the semiconductor chip. It may be required that the conductive line has a relatively low resistance to supply power required for operations of the circuit element.

However, as the semiconductor packages become miniaturized, slimmer and lightweight, a width of the conductive line of the semiconductor chip is being reduced. Accordingly, the conductive line for transferring the signals to/from the circuit element of the semiconductor chip may have a relatively high voltage drop. Therefore, a new routing connection having a relatively low resistance without affecting the size of the semiconductor chip is required.

SUMMARY

Example embodiments of the present general inventive concept provide a semiconductor chip where an input signal can be inputted by an external connection line.

Example embodiments of the present general inventive concept can also provide a wiring substrate mounting of the semiconductor chip.

Example embodiments of the present general inventive concept can also provide a semiconductor package including the semiconductor chip.

Example embodiments of the present general inventive concept can also provide a display device including the semiconductor package.

Additional embodiments of the present general inventive concept will be set forth in part in the description which follows and, in part, will be obvious from the description, or may be learned by practice of the general inventive concept.

Example embodiments of the present general inventive concept provide a semiconductor chip including a semiconductor substrate, an input portion and an output portion. A circuit element can be formed in the semiconductor substrate. The input portion can be formed on the semiconductor substrate. The input portion can include a first input pad to receive an input signal from the outside and a second input pad spaced apart from the first input pad, the second input pad being electrically connected to the first input pad through an external connection line such that the second input pad inputs the input signal to the circuit element. The output portion can be formed on the semiconductor substrate. The output pad can include an output pad to output an output signal from the circuit element.

In an example embodiment, the input portion may include a first input pad to receive the input signal, a connection pad adjacent to the first input pad and electrically connected to the external connection line and a trace formed in the semiconductor substrate to electrically connect the first input pad and the connection pad to each other.

The input portion may further include at least one isolated trace formed to be isolated between the first input pad and the second input pad, and end portions of the isolated trace may be electrically connected to the first input pad and the second input pad respectively by the external connection line.

An electrostatic discharge (ESD) circuit may be electrically connected to the first input pad. An ESD circuit may not be electrically connected to the second input pad.

The first input pad may be formed in a first peripheral edge portion of the semiconductor substrate and the output pad may be formed in a second peripheral edge portion opposite to the first peripheral edge portion.

The first input pad and the second input pad may be arranged along a line extending from the first input pad toward the output pad.

The semiconductor chip may be mounted on a base film and the external connection line may be formed to be isolated within a chip-mounted region of the base film.

Example embodiments of the present general inventive concept can also provide a wiring substrate of a semiconductor package including a base film, a wiring pattern and at least one connection line. The base film can have a chip-mounted region where a semiconductor chip can be mounted thereon. The wiring pattern can extend from the chip-mounted region. The wiring pattern can include an input wiring electrically connected to a first input pad of the semiconductor chip and an output wiring electrically connected to an output pad of the semiconductor chip. The connection line can be formed to be isolated from the wiring pattern within the chip-mounted region to electrically connect the first input pad of the semiconductor chip to a second input pad of the semiconductor chip spaced apart from the first input pad.

A connection end portion of the input wiring may be arranged in a first peripheral edge portion of the chip-mounted region and a connection end portion of the output wiring may be arranged in a second peripheral edge portion of the chip-mounted region opposite to the first peripheral edge portion.

The connection line may be arranged along a line extending from the first input pad toward the output pad.

A connection end portion of the input wiring may be arranged in a first peripheral edge portion of the chip-mounted region and a connection end portion of the output wiring may be arranged in a third peripheral edge portion of the chip-mounted region adjacent to the first peripheral edge portion. The connection line may include a folded portion extending from the first peripheral edge portion toward the third peripheral edge portion.

Example embodiments of the present general inventive concept can also provide a semiconductor package including a base film, a semiconductor chip, a wiring pattern and at least one connection line. The semiconductor chip can be mounted on a chip-mounted region of the base film, the semiconductor chip can include a first input pad to receive an input signal from the outside, a second input pad spaced apart from the first input pad and an output pad to output an output signal. The wiring pattern can extend from the chip-mounted region, and the wiring pattern can include an input wiring electrically connected to the first input pad of the semiconductor chip and an output wiring electrically connected to the output pad of the semiconductor chip. The connection line can be formed to be isolated from the wiring pattern within the chip-mounted region of the base film to electrically connect the first input pad of the semiconductor chip to the second input pad of the semiconductor chip.

The semiconductor chip may further include a connection pad spaced apart from the first input pad and electrically connected to the connection line and a trace to electrically connect the first input pad and the connection pad to each other.

A connection end portion of the input wiring may be arranged in a first peripheral edge portion of the chip-mounted region and a connection end portion of the output wiring may be arranged in a second peripheral edge portion of the chip-mounted region opposite to the first peripheral edge portion.

The semiconductor chip may further include at least one isolated trace formed to be isolated between the first input pad and the second input pad, and end portions of the isolated trace may be electrically connected to the first input pad and the second input pad respectively by the connection line.

The semiconductor chip may include an electrostatic discharge (ESD) circuit electrically connected to the first input pad. It is possible that the ESD circuit may not be electrically connected to the second input pad.

Example embodiments of the present general inventive concept can also provide a display device including a semiconductor package, a printed circuit board (PCB) and a display panel. The semiconductor package can include a base film, a semiconductor chip mounted on a chip-mounted region of the base film a semiconductor chip and an input and output wirings extending from the chip-mounted region to be electrically connected to the semiconductor chip. The PCB can be electrically connected to the input wiring and disposed in a first end portion of the semiconductor package. The display panel can be electrically connected to the output wiring and disposed in a second end portion of the semiconductor package. The semiconductor chip can include a first input pad to receive an input signal from the outside, a second input pad spaced apart from the first input pad, and an output pad to output an output signal. The semiconductor package can include at least one connection line isolated from the input and output wirings within the chip-mounted region of the base film to electrically connect the first input pad of the semiconductor chip to the second input pad of the semiconductor chip.

Example embodiments of the present general inventive concept can also provide a semiconductor chip including an input portion to input an input signal to circuit elements formed therein. The input portion can include a first input pad formed in a semiconductor substrate and a second input pad spaced apart from the first input pad. The first input pad can be electrically connected to an input wiring of a base film where the semiconductor chip is mounted.

The circuit element of the semiconductor chip can be connected to the input wiring through an external connection line such that spaces to accommodate the inner connection lines may not be required, thus reducing a size of the semiconductor chip. The external connection lines may have a relatively low resistance to improve performance characteristics of the semiconductor package including the semiconductor mounted therein.

Example embodiments of the present general inventive concept can also provide a semiconductor chip having at least one circuit element formed therein, the semiconductor chip including a first input portion disposed on a first area of the semiconductor chip to receive an input signal from an external power source, and a second input portion disposed on a second area of the semiconductor chip separate from the first area to receive the input signal via an external connection line from the first input portion, and to input the input signal to the at least one circuit element.

The first and second input portions can be electrically isolated from one another on the semiconductor chip when the first and second input portions are disconnected from the external connection line.

The semiconductor chip may further include an output portion formed on a third area of the semiconductor chip separate from the first and second areas to output an output signal from the circuit element.

The semiconductor may further include a base film to mount the semiconductor chip and having the external connection line isolated from the semiconductor chip therein.

The semiconductor chip may further include a trace line isolated between the first and second input portions such that end portions of the trace line are electrically connected to the first input portion and the second input portion, respectively, by the external connection line.

BRIEF DESCRIPTION OF THE DRAWINGS

These and/or other embodiments of the present general inventive concept will become apparent and more readily appreciated from the following description of the embodiments, taken in conjunction with the accompanying drawings of which.

DETAILED DESCRIPTION OF THE EMBODIMENTS

Figure 1:
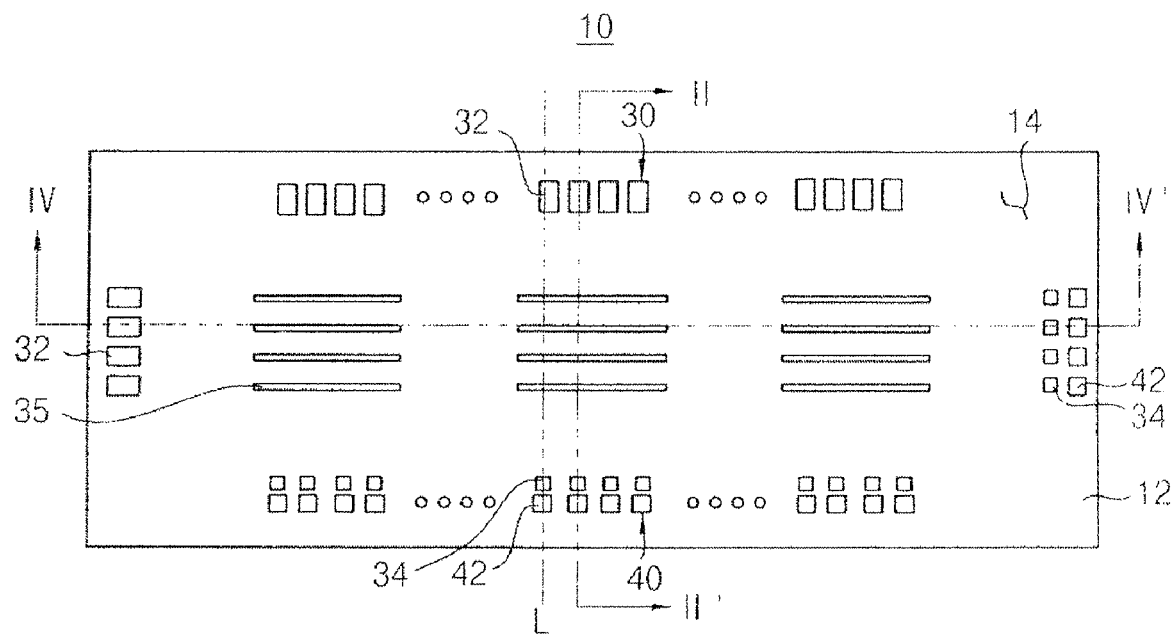
FIG. 1 is a plan view illustrating a semiconductor chip in accordance with example embodiments of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures. In the drawings, the sizes and relative sizes of layers and regions may be exaggerated for clarity. Those skilled in the art will appreciate that the present general inventive concept may be embodied in many different forms and should not be construed as limited to the example embodiments set forth herein.

Those skilled in the art will understand that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will also be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the present general inventive concept will be described below with reference to the accompanying drawings.

Figure 2:
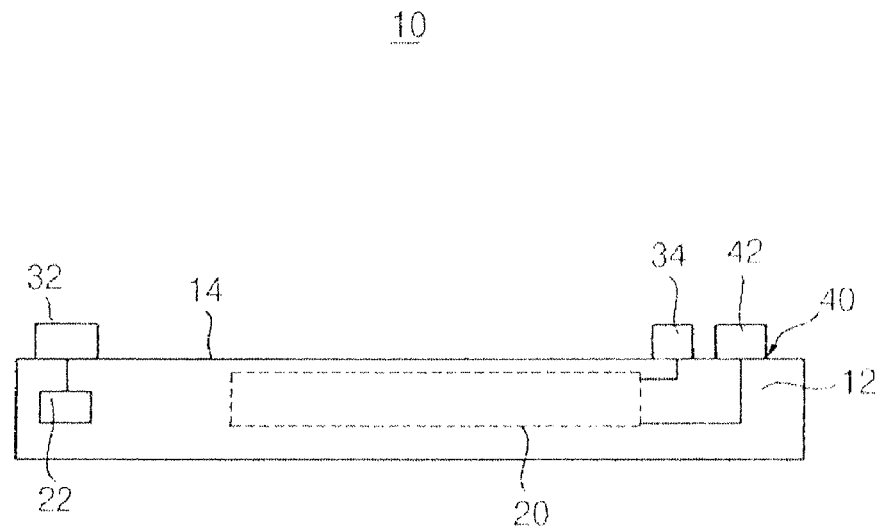
FIG. 2 is a cross-sectional view taken along a line II-II' in FIG. 1.

FIG. 1 is a plan view illustrating a semiconductor chip in accordance with an example embodiment of the present general inventive concept. FIG. 2 is a cross-sectional view taken along a line II-II' in FIG. 1.

Referring to FIGS. 1 and 2, a semiconductor chip 10 can include a semiconductor substrate 12, and an input portion 30 and an output portion 40 formed on the semiconductor substrate 12.

In an example embodiment, a silicon wafer including circuit elements 20 formed therein may be cut to form the semiconductor chip 10. After a process of inspecting electrical properties of the semiconductor chips 10, each of the semiconductor chips 10 may be mounted on a mounting substrate (not illustrated) such as a base film to form a semiconductor package.

The semiconductor substrate 12 may include a plurality of the circuit elements 20. The circuit element 20 may include a plurality of memory devices. Examples of memory devices may be a volatile memory device and a non-volatile memory device. Examples of the volatile memory device may be DRAM, SRAM, etc. Examples of the non-volatile memory device may be EPROM, EEPROM, Flash EEPROM, etc.

In an example embodiment, the input portion 30 and the output portion 40 may be formed on a first surface 14 of the semiconductor substrate 12. The input portion 30 may include a plurality of input pads. The output portion 40 may include a plurality of output pads. The first surface 14 of the semiconductor substrate 12 may face with a chip-mounted region of the base film (not illustrated) where the semiconductor chip 10 is mounted.

The input portion 30 can include a first input pad 32 to receive an external input signal and a second input pad 34 to input the input signal to the circuit element 20.

A plurality of the first input pads 32 can be arranged to be spaced apart from one another along a first peripheral edge portion. In an example embodiment, the first input pad 32 may be electrically connected to an input wiring of the mounting substrate (not illustrated) where the semiconductor chip 10 is mounted, via a bump interposing therebetween.

For example, the first input pad 32 may be electrically connected to the input wiring such as a power line, a ground line or a signal line. Accordingly, the first input pad 32 may receive an input signal from the outside.

A plurality of the second input pads 34 can be arranged to be spaced apart from one another along a second peripheral edge portion opposite to the first peripheral edge portion. The second input pad 34 may be electrically connected to the circuit elements 20 formed in the semiconductor substrate 12.

Figure 5:
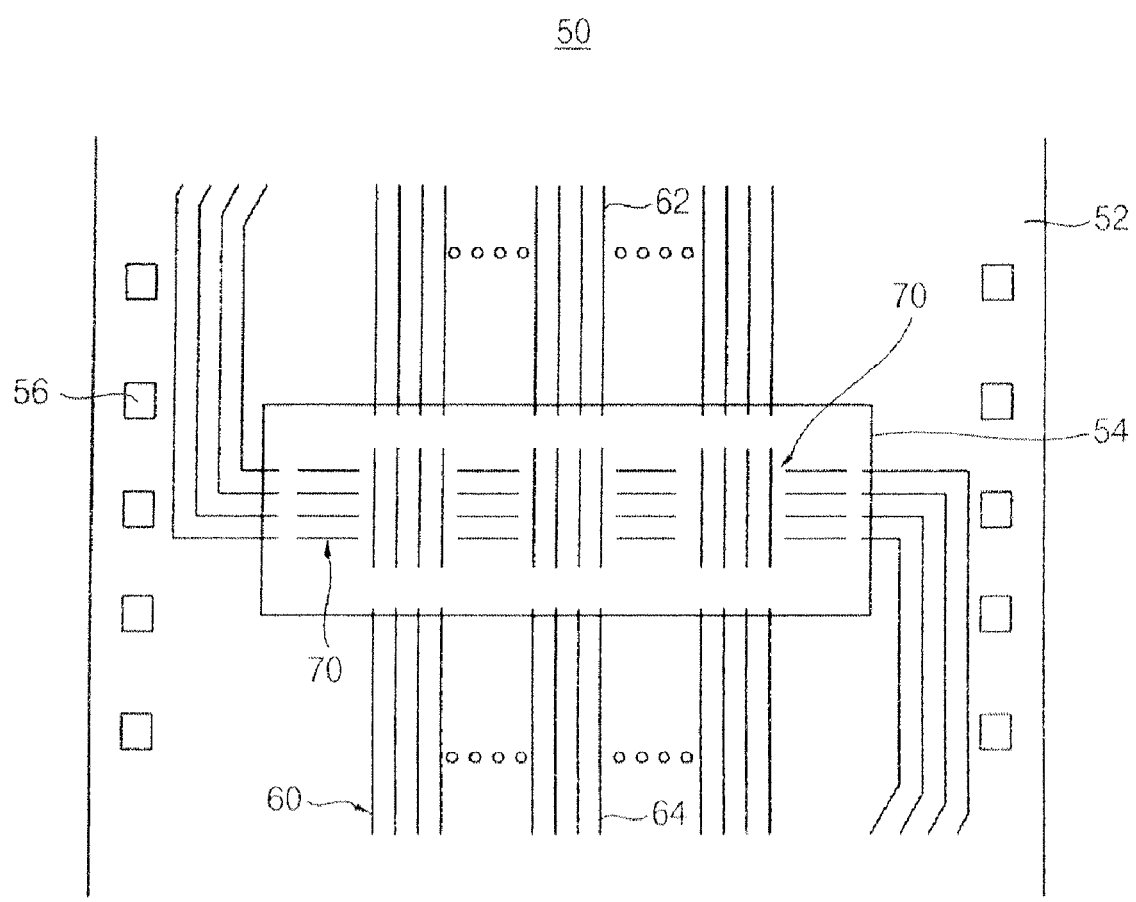
FIG. 5 is a plan view illustrating a wiring substrate to mount the semiconductor chip in FIG. 1.

In an example embodiment, the first input pad 32 and the second input pad 34 may be arranged along a line L extending from the first input pad 32 toward an output pad 42. Although it is not illustrated in the figure, the first input pad 32 and the second input pad 34 can be electrically connected to each other by an external connection line 70, as illustrated in FIG. 5. In this case, the external connection line may be formed to be isolated within the chip-mounted region where the semiconductor chip 10 is formed.

The second input pad 34 may be electrically connected to the first input pad 32 by the external connection line. The second input pad 34 may provide the input signal to the circuit element 20. Accordingly, the input signal may be provided to the second input pad 34 formed at a desired position through the external connection line, such that a desired connection path may be created without using a conductive line formed in the semiconductor chip 10.

The output portion 40 may include a plurality of the output pads 42. A plurality of the output pads 42 may be arranged to be spaced apart from one another along a second peripheral edge portion opposite to the first peripheral edge portion. Alternatively, a plurality of the output pads 42 may be arranged to be spaced apart from one another along a third peripheral edge portion adjacent to the first peripheral edge portion.

The output pad 42 may be arranged to be adjacent to the second input pad 34. The output pad 42 may be electrically connected to the circuit element 20 in the semiconductor substrate 12. In an example embodiment, the output pad 42 may be electrically connected to an output wiring of the mounting substrate (not illustrated) where the semiconductor chip 10 is mounted, via a bump interposing therebetween. Accordingly, the output pad 42 may output an output signal from the circuit element 20 to the output wiring.

A conventional inner connection line may be formed in the semiconductor substrate 12 to have a first width. For example, the first width of a conventional inner connection line may be about 1 µm. In example embodiments, the external connection line may have a second width greater than the first width. The second width of the external connection line may be about five to ten times the first width. For example, the first width may be about 1 µm and the second width may be about 8 µm. Accordingly, as the width of the external connection line is greater than the width of a conventional inner connection line, the input signal may be inputted to the circuit element 20 in the semiconductor substrate 12 through the external connection line having a resistance lower than a conventional connection line.

Further, because the circuit element 20 of the semiconductor chip 10 can be connected to the input wiring through the external connection line instead of a conventional inner connection line, spaces to accommodate the inner connection lines may not be required, thus reducing a size of the semiconductor chip 10.

Figure 3:
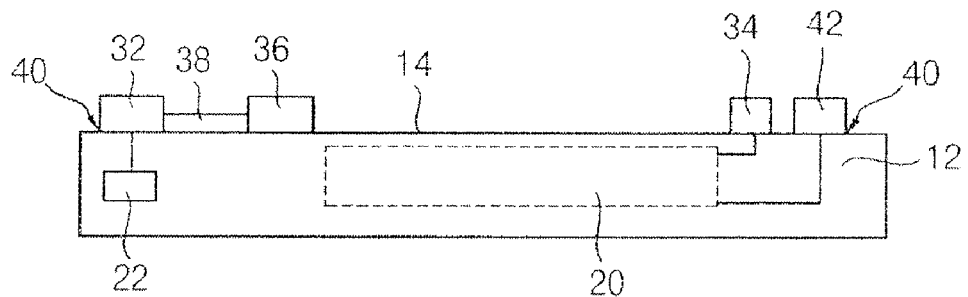
FIG. 3 is a cross-sectional view illustrating a semiconductor chip in accordance with another example embodiment of the present general inventive concept.
Figure 4:
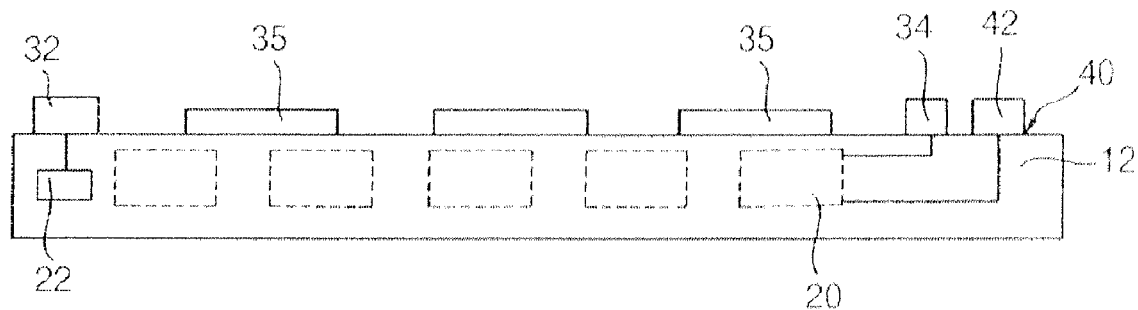
FIG. 4 is a cross-sectional view taken along a line IV-IV' in FIG. 1.

Referring to FIGS. 2 to 4, the semiconductor chip 10 may include an electrostatic discharge ESD circuit 22 that is electrically connected to the first input pad 32. The ESD circuit 22 may be formed in the semiconductor substrate 12 and may be connected only to the first input pad 32.

Accordingly, it is possible that the ESD circuit may not be connected to the second input pad 34. That is, because the second input pad 34 can be connected to the external connection line, the ESD circuit may not be required for the second input pad 34. Therefore, it may not be required to form an additional pad for the EDS circuit to be connected to the second input pad 34 of the semiconductor chip, thus further miniaturizing the semiconductor chip 10.

The ESD circuit 22 may include a diode, a MOS transistor, a silicon controlled rectifier SCR, etc., although the present general inventive concept is not limited thereto. The EDS circuit 22 may be electrically connected to the first input pad 32 to protect the circuit element 20 when a high voltage flows into the semiconductor chip 10.

FIG. 3 is a cross-sectional view illustrating a semiconductor chip in accordance with another example embodiment of the present general inventive concept.

Referring to FIG. 3, the input portion 30 of the semiconductor chip 10 may include a first input pad 32, a connection pad 36 and a trace 38.

The first input pad 32 may receive an input signal from the outside. The connection pad 36 may be arranged to be adjacent to the first input pad 32. The connection pad 36 may be electrically connected to the external connection line by a bump formed therebetween. The trace 38 may be formed in the semiconductor substrate 12. The trace 38 may electrically connect the first input pad 32 and the connection pad 36 to each other.

The connection pad may be arranged to be adjacent to the first input pad 32. A plurality of the connection pads may be arranged to be spaced apart from one another along the first peripheral edge portion of the semiconductor substrate 12.

The first input pad 32 and the connection pad 36 may be electrically connected by the trace 38 formed in the semiconductor substrate 12. The trace 38 may be formed on an upper surface of the semiconductor substrate 12. Alternatively, the trace 38 may be formed in an inner portion of the semiconductor substrate 12.

The input signal inputted to the first input pad 32 may be transferred to the second input pad 34 through the trace 38, the connection pad 36, and the external connection line. Accordingly, the input signal applied to the first peripheral edge portion of the semiconductor substrate 12 may be applied to the second input pad 34 arranged in the second peripheral edge portion opposite to the first peripheral edge portion. The input signal may be inputted to the circuit element 20 formed in the semiconductor substrate 12 through the external connection line.

In another example embodiment, the first input pad 32 may be formed to be spaced apart from the connection pad 36. Accordingly, the first input pad 32 may be easily adhered to a connection end portion of the input wiring by the bump. The connection pad 36 may be easily adhered to the external connection line by the bump.

FIG. 4 is a cross-sectional view taken along a line IV-IV' in FIG. 1.

Referring to FIGS. 1 and 4, a plurality of the first input pads 32 may be formed to be spaced apart from one another along the third peripheral edge portion adjacent to the first peripheral edge portion. The first input pad 32 may receive an input signal from the outside.

A plurality of the second input pads 34 may be formed to be spaced apart from one another along a fourth peripheral edge portion opposite to the third peripheral edge portion. The second input pad 34 may be electrically connected to the circuit element 20 formed in the semiconductor substrate 12.

The output pads 42 of the output portion 40 may be formed to be spaced apart form one another along the fourth peripheral edge portion. The output pad 42 may be arranged to be adjacent to the second input pad 34.

The input portion 30 may further include at least one isolated trace 35 between the first input pad 32 and the second input pad 34. The isolated trace 35 may be formed to be isolated from the first and second input pads 32 and 34. The isolated trace 35 may be formed on an upper surface of the semiconductor substrate 12 or may be formed in an inner portion of the semiconductor substrate 12.

The first input pad 32 and the second input pad 34 may be electrically connected to each other by the isolated traces 35 and the external connection lines 70 (See FIG. 5).

In an example embodiment, a first external connection line may be arranged along a first extended line to connect the first and second input pads that are respectively formed in the first and second peripheral edge portions of the semiconductor substrate 12. A second external connection line may be arranged along a second extended line substantially perpendicular to the first extended line to connect the first and second input pads 32 and 34 that are respectively formed in the third and fourth peripheral edge portions of the semiconductor substrate 12.

Accordingly, the first input pad 32 and the second input pad 34 arranged along the second extended line may be electrically connected by the isolated trances 35. Here, because the second connection lines spaced apart from one another along the second extended line can be connected by the isolated traces 35, it is possible that the second connection line may not be electrically connected to the first connection line.

Those skilled in the art will appreciate that the number, length and thickness of the isolated traces 35 may be determined considering the number of, or the distance between the external connection lines that respectively connect the first and second input pads arranged along the extended lines perpendicular to each other and a distance between the external connection lines, etc., and the present general inventive concept is not limited to any particular arrangement thereof.

FIG. 5 is a plan view illustrating a wiring substrate to mount the semiconductor chip in FIG. 1.

Referring to FIGS. 1 and 5, a wiring substrate 50 of a semiconductor package can include a base film 52 having a chip-mounted region 54 where the semiconductor chip 10 is mounted, a wiring pattern 60 extending from the chip-mounted region 54 and at least one connection line 70 isolated from the wiring pattern 60 within the chip-mounted region 54.

In an example embodiment, the base film 52 may include an organic material such as polyimide. For example, the base film may be a flexible organic film. The chip-mounted region 54 where the semiconductor chip 10 is mounted may be provided in the middle of the base film 52.

Sprocket holes 56 may be positioned along two opposite edges of the base film 56. The sprocket holes 56 can be spaced apart from one another in a first direction. In a manufacture of a semiconductor package, the sprocket hole 56 may be used for position calibration of the semiconductor package and movement of the base film 52. After the semiconductor chip 10 is mounted on the base film 52, two opposite edges of the base film 52 having the sprocket hole 56 may be removed.

The wiring pattern 60 can be formed on the base film 52. The wiring pattern 60 may include a plurality of input wirings 62 and a plurality of output wirings 64. The input wirings 62 and the output wirings 64 may extend from the inside to the outside of the chip-mounted region 54 of the base film 52.

For example, after a metal thin film may be adhered to a surface of the base film 52 by an electrodeposition or thermocompression process, a photolithography process and an etch process may be performed on the metal thin film to form the wiring pattern 60. Examples of the metal may be copper (Cu), gold (Au), tin (Sn), lead (Pb), silver (Ag), nickel (Ni), etc.

The input wiring 62 and the output wiring 64 may be formed to extend in the first direction from the chip-mounted region 54. The input wiring 62 and the output wiring 64 may include connection end portions to be adhered to input pads and output pads of the semiconductor chip 10 by bumps, respectively. Accordingly, the connection end portions of the input and output wirings 62 and 64 may be connected to the input and output pads of the semiconductor chip 10, respectively.

The connection end portion of the input wiring 62 may be electrically connected to the first pad 32 of the semiconductor chip 10 by the bump. The connection end portion of the output wiring 64 may be electrically connected to the output pad 42 of the semiconductor chip 10 by the bump.

The connection line 70 may be formed to be isolated between the connection end portion of the input wiring 62 and the connection end portion of the output wiring 64. The connection line 70 may extend in a direction from the first input pad 32 toward the output pad 42.

The connection line 70 may be formed together when the wiring pattern 60 is formed on the base film 52. For example, the connection line 70 may include copper (Cu). Accordingly, the connection line 70 may have a greater width and a lower resistance than a conventional conductive line formed in the semiconductor chip.

In an example embodiment, an end portion of the connection line 70 may be electrically connected to the first input pad 32 of the semiconductor chip 10 by the bump. The other end portion of the connection line 70 may be electrically connected to the second input pad 34 of the semiconductor chip 10 by the bump. Accordingly, the connection line 70 may electrically connect the first input pad 32 and the second input pad 34 of the semiconductor chip 10 to each other.

In another example embodiment, as illustrated in FIG. 3, an end portion of the connection line 70 may be electrically connected to the connection pad 36 of the semiconductor chip 10 by the bump. The other end portion of the connection line 70 may be electrically connected to the second input pad 34 of the semiconductor chip 10. Accordingly, the connection line 70 may electrically connect the first input pad 32 and the second input pad 34 of the semiconductor chip 10 to each other.

Figure 6:
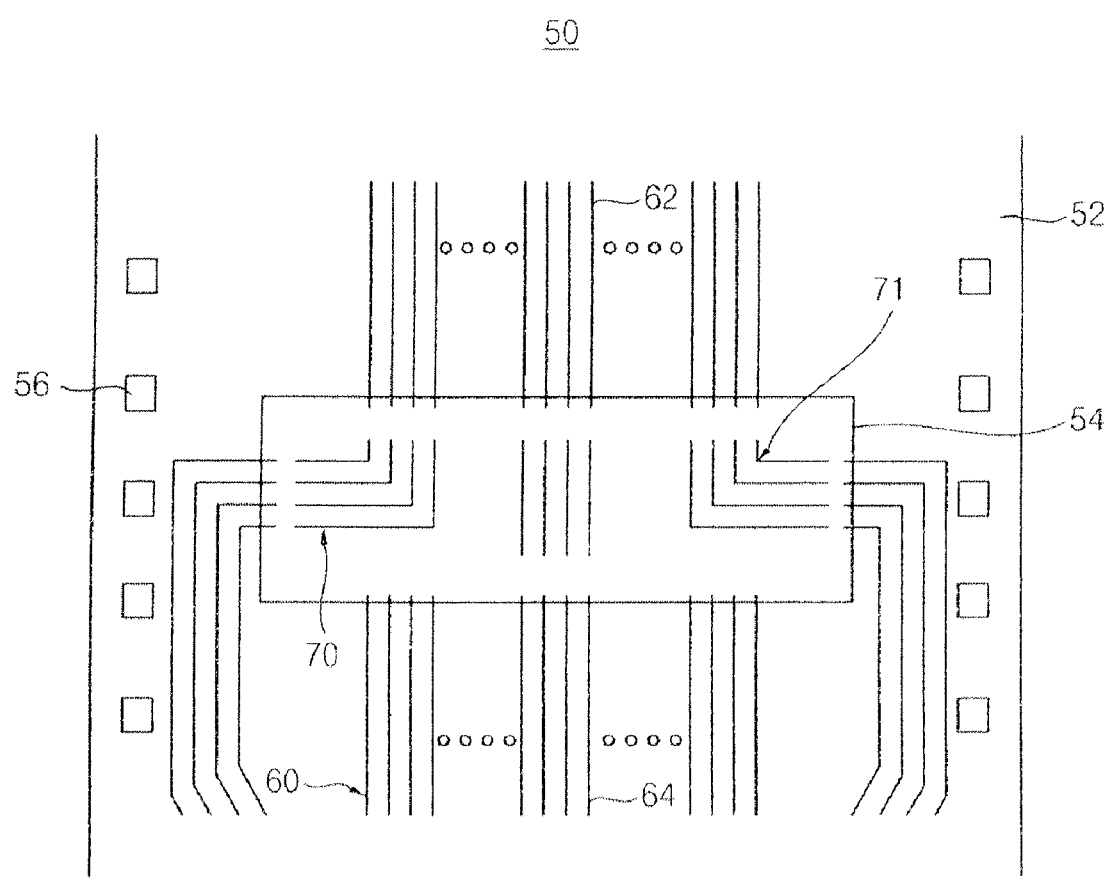
FIG. 6 is a plan view illustrating a wiring substrate in accordance with another example embodiment of the present general inventive concept.

FIG. 6 is a plan view illustrating a wiring substrate in accordance with another example embodiment of the present general inventive concept.

Referring to FIGS. 1 and 6, the first input pads 32 may be arranged in the first peripheral edge portion of the semiconductor substrate 12 and the second input pads 34 may be arranged in the third peripheral edge portion or the fourth peripheral edge portion of the semiconductor substrate 12 adjacent to the first peripheral edge portion. The output pads 42 may be arranged adjacent to the second input pads 34.

The connection line 70 may be formed to extend in a direction from the first peripheral edge portion toward the third peripheral edge portion. The connection line 70 may be formed to extend in a direction from the first peripheral edge portion toward the fourth peripheral edge portion.

Accordingly, as illustrated in FIG. 6, the connection line 70 may include a folded portion 71 having ends extending in a first direction and a second direction substantially perpendicular to the first direction. Therefore, the second input pads 34 may be arranged at a desired position, and the first input pad 32 and the second input pad 34 may be connected to each other by the folded portion 71 of the connection line 70.

Figure 7:
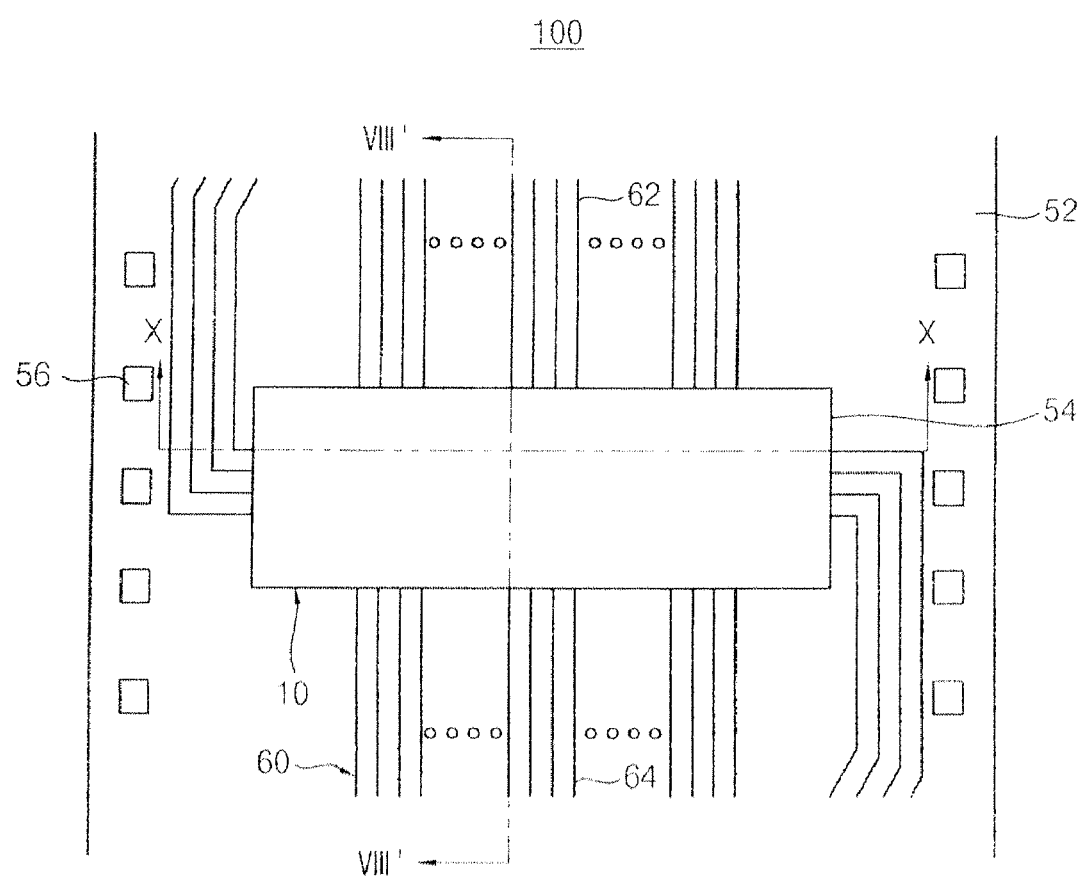
FIG. 7 is a plan view illustrating a semiconductor package including the semiconductor chip in FIG. 1 mounted thereon.
Figure 8:
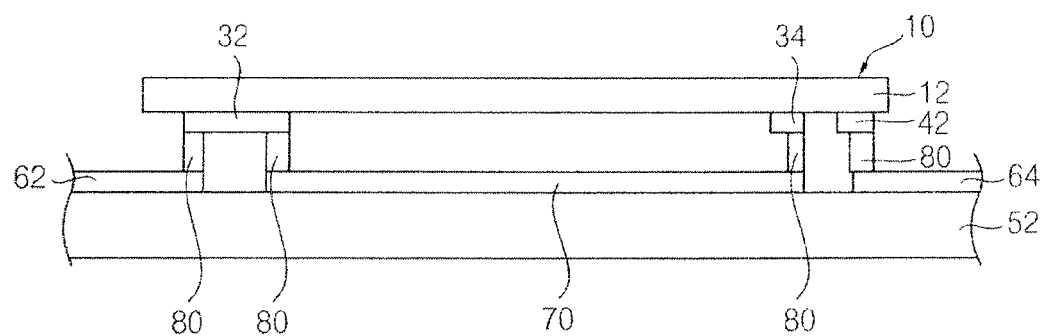
FIG. 8 is a cross-section view taken along a line VIII-VIII' in FIG. 7.

FIG. 7 is a plan view illustrating a semiconductor package 100 including the semiconductor chip in FIG. 1 mounted thereon. FIG. 8 is a cross-section view taken along a line VIII-VIII' in FIG. 7.

Referring to FIGS. 1, 7 and 8, the semiconductor chip 10 may be mounted on the base film 52 via bumps 80. In an example embodiment, a plastic resin (not illustrated) may fill up a portion where the semiconductor chip 10 is bonded to the base film 52. For example, the portion where the semiconductor chip 10 is bonded to the base film 52 may be filled with the plastic resin through an under-fill process.

The first input pads 32 may be arranged in the first peripheral edge portion of the semiconductor substrate 12. The connection end portion of the input wiring 62 may be arranged corresponding to the first input pad 32 in the first peripheral edge portion of the chip-mounted region 54 of the base film 52.

The second input pads 34 may be arranged in the second peripheral edge portion of the semiconductor substrate 12 opposite to the first peripheral edge portion. The output pads 42 may be arranged adjacent to the second input pads 34. The output pads 42 may be arranged in the second peripheral edge portion. The connection end portion of the output wiring 62 may be arranged corresponding to the first input pad 32 in the second peripheral edge portion of the chip-mounted region 54 of the base film 52 opposite to the first peripheral edge portion.

The connection line 70 may be formed within the chip-mounted region 54 of the base film 52. The connection line 70 may be arranged between the input wiring 62 and the output wiring 64. The connection line 70 may be formed to be isolated from the input wiring 62 and the output wiring 64.

The first input pad 32 may have a plane area the same as that of the second input pad 34. Alternatively, the first input pad 32 may have a plane area different from that of the second input pad 34. In an example embodiment, the first input pad 32 may have a first plane area and the second input pad 34 may have a second plane area smaller than the first plane area.

The end portion of the first input pad 32 may be adhered to the connection end portion of the input wiring 62 by the bump 80. The output pad 42 may be adhered to the connection end portion of the output wiring 64.

The other end portion of the first input pad 32 may be adhered to the end portion of the connection line 70 on the base film 52 by the bump 80. The second input pad 34 may be adhered to the other end portion of the connection line 70 on the base film 52 by the bump 80. Accordingly, the first and second input pads 32 and 34 spaced apart from one another on the semiconductor substrate 12 may be electrically connected to each other by the connection line 70 on the base film 52.

The first input pad 32 may receive an input signal from the input wiring 62. The input signal may be applied to the second input pad 34 by the connection line 70 on the base film 52. Then, the input signal may be applied to the circuit element (not illustrated) in the semiconductor chip 10 that is connected to the second input pad 34. An output signal may be outputted from the circuit element to the output wiring 64 through the output pad 42.

Accordingly, the input signal may be inputted to the circuit element in the semiconductor chip 10 through the connection line 70 isolated on the base film 52 to be used as an external connection path outside the semiconductor chip 10.

According to example embodiments of the present general inventive concept, the connection line 70 may have a greater width and a lower resistance lower than a connection line to be formed in the semiconductor chip 10. Accordingly, electrical signals may be transferred rapidly to the circuit element of the semiconductor chip through the external connection line and spaces for the inner connection path in the semiconductor chip 10 may not be required, thus reducing a size of the semiconductor chip.

In an example embodiment, the semiconductor chip 10 may include an ESD circuit that is electrically connected to the first input pad 32. However, because the ESD circuit is not required for the second input pad 34 and is not connected to the second input pad 34, the second input pad 34 may be formed at a desired position to be connected to the external connection line 70 outside the semiconductor chip 10.

Therefore, it may not be required to form an additional pad for the EDS circuit to be connected to the second input pad 34 of the semiconductor chip 10, thus further reducing or miniaturizing the size of the semiconductor chip 10.

Figure 9:
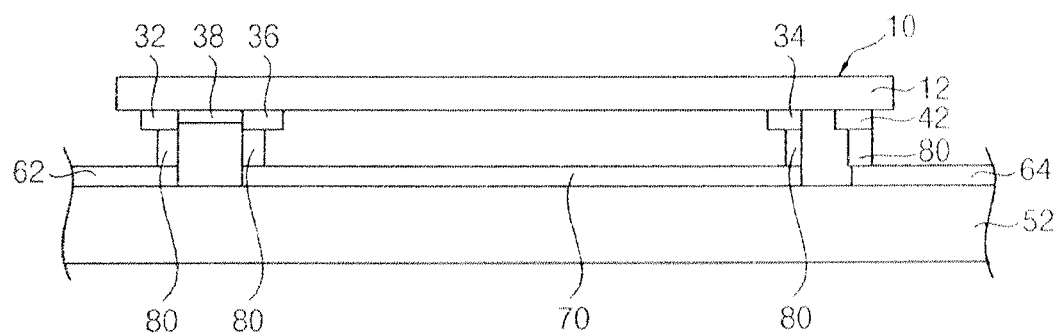
FIG. 9 is a cross-sectional view illustrating a semiconductor package in accordance with another example embodiment of the present general inventive concept.

FIG. 9 is a cross-sectional view illustrating a semiconductor package in accordance with another example embodiment of the present general inventive concept.

Referring to FIG. 9, the input portion 30 of the semiconductor chip 10 may include a first input pad 32, a connection pad 36 and a trace 38.

A plurality of the first input pads 32 and the connection pads 36 may be arranged to be spaced apart from one another along the first peripheral edge portion of the semiconductor substrate 12. The first input pad 32 may be adhered to the connection end portion of the input wiring 62 on the base film 52 by the bump 80. The first input pad 32 may receive an input signal from the input wiring 62.

The connection pad 36 may be arranged to be adjacent to the first input pad 32. The connection pad 36 may be spaced apart form the first input pad 32. The connection pad 36 may be electrically connected to the end portion of the connection line 70 on the base film 52 by the bump 80.

The first input pad 32 and the connection pad 36 may be electrically connected to each other by the trace 38. The trace 38 may be formed on an upper surface of the semiconductor substrate 12. Alternatively, the trace 38 may be formed in an inner portion of the semiconductor substrate 12.

The input signal inputted to the first input pad 32 may be transferred to the second input pad 34 through the trace 38, the connection pad 36, and the connection line 70.

In another example embodiment, the first input pad 32 may be formed to be spaced apart from the connection pad 36. Accordingly, the first input pad 32 and the connection pad 36 may be easily adhered to the connection end portion of the input wiring 62 and the end portion of the connection line 70 by the bumps, respectively.

Figure 10:
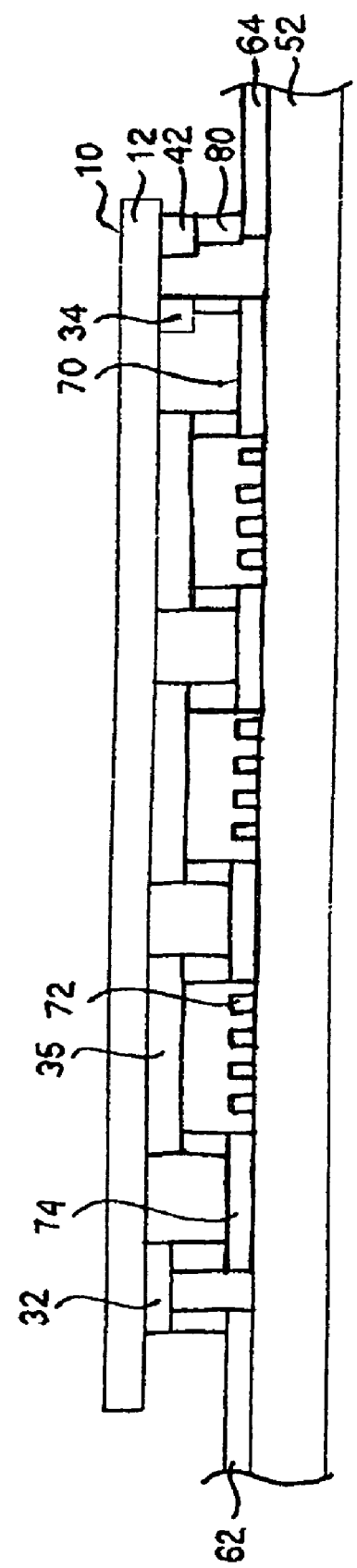
FIG. 10 is a cross-section view taken along a line X-X' in FIG. 7.

FIG. 10 is a cross-section view taken along a line X-X' in FIG. 7.

Referring to FIGS. 1, 7 and 10, a plurality of the first input pads 32 may be formed to be spaced apart from one another along the third peripheral edge portion of the semiconductor substrate 12 adjacent to the first peripheral edge portion. A plurality of the second input pads 34 may be formed to be spaced apart from one another along a fourth peripheral edge portion of the semiconductor substrate 12 opposite to the third peripheral edge portion. The output pads 42 may be formed to be spaced apart form one another along the fourth peripheral edge portion.

The input portion 30 of the semiconductor chip 10 may further include at least one isolated trace 35 between the first input pad 32 and the second input pad 34. The isolated trace 35 may be formed to be isolated from the first and second input pads 32 and 34. The isolated trace 35 may be formed on an upper surface of the semiconductor substrate 12 or may be formed in an inner portion of the semiconductor substrate 12.

The first input pad 32 and the second input pad 34 may be electrically connected to each other by the isolated traces 35 and the connection lines 70.

In an example embodiment, a first external connection line 72 may be arranged on the base film 52 along a first extended line to connect the first and second input pads that are respectively formed in the first and second peripheral edge portions of the semiconductor substrate 12. The first external connection line 72 may extend along the first extended line.

A second external connection line 74 may be arranged on the base film 12 along a second extended line substantially perpendicular to the first extended line to connect the first and second input pads 32 and 34 that are respectively formed in the third and fourth peripheral edge portions of the semiconductor substrate 12.

Accordingly, the first input pad 32 and the second input pad 34 arranged along the second extended line may be electrically connected by the isolated trances 35. Here, because the second connection lines 74 spaced apart from one another along the second extended line can be connected by the isolated traces 35, it is possible that the second connection line 74 may not be electrically connected to the first connection line 72.

Those skilled in the art will appreciate that the number, length and thickness of the isolated traces 35 may be determined considering the number of, or the distance between the external connection lines that respectively connect the first and second input pads arranged along the extended lines perpendicular to each other and a distance between the external connection lines, etc., and the present general inventive concept is not limited to any particular arrangement thereof.

Hereinafter, an exemplary display device including the semiconductor package in accordance with example embodiments of the present general inventive concept will be described.

Figure 11:
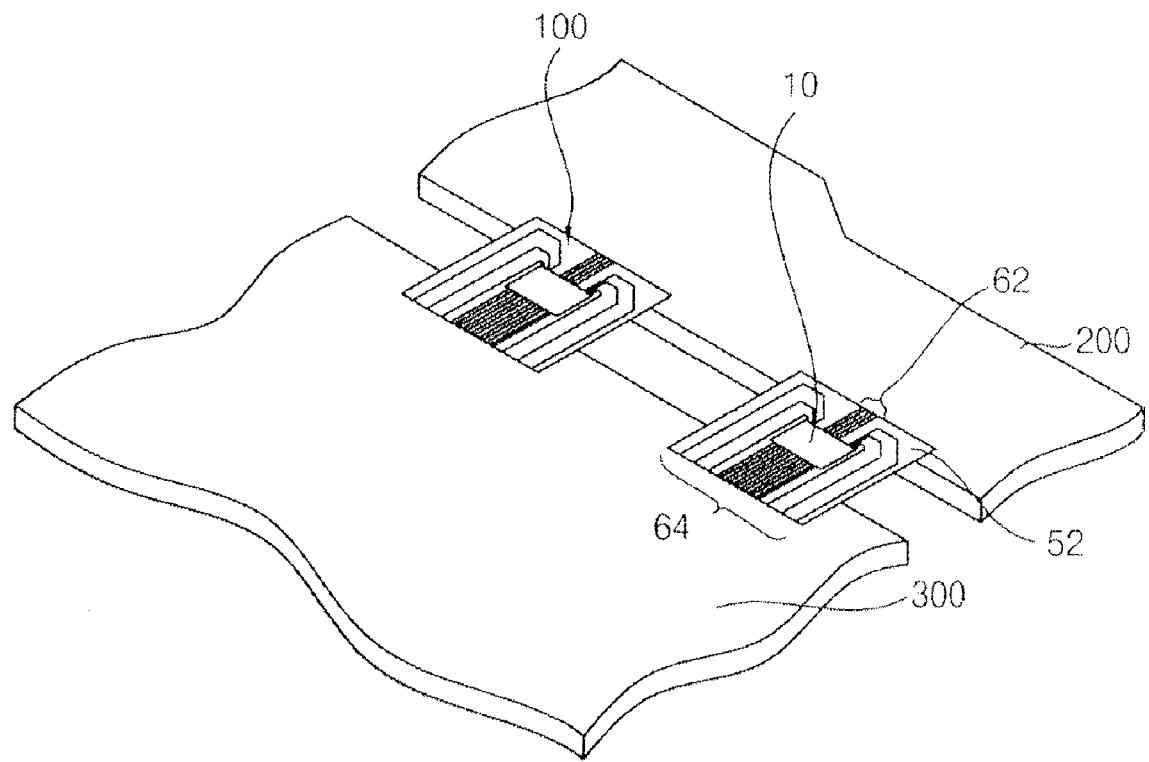
FIG. 11 is a plan view illustrating a display device including the semiconductor package in accordance with example embodiments of the present general inventive concept.

FIG. 11 is a plan view illustrating a display device including the semiconductor package in accordance with example embodiments of the present general inventive concept.

Referring to FIG. 11, a display device 500 can include the semiconductor package 100, a display panel 300 and a PCB 200. The semiconductor package 100 may be disposed between the display panel 30 and the PCB 200. The PCB 200 may be disposed in a first end portion of the semiconductor package 100 and the display panel 300 may be disposed in a second end portion of the semiconductor package 100.

The input wirings 62 of the semiconductor package 100 can be electrically connected to the PCB 200. The output wirings 64 of the semiconductor package 100 can be electrically connected to the display panel 300.

For example, the display panel 300 may include a plurality of gate lines, a plurality of data lines and a plurality of pixels. The pixels may be formed on each intersection of the gate lines and the data lines. The pixel may include a thin-film transistor (TFT) having a gate electrode connected to the gate line and a source electrode connected to the data line.

The semiconductor chip 10 mounted on the semiconductor package 100 may include driving circuits to drive the display panel 300. For example, the semiconductor chip 10 of the semiconductor package 100 may include a gate driver to drive the gate lines of the display panel 300. The semiconductor chip 10 of the semiconductor package 100 may include a data driver to drive the data lines of the display panel 500.

The PCB 200 may be electrically connected to the input wiring 62 of the semiconductor package 100. For example, the PCB 200 may include a timing controller (not illustrated) and a power supply (not illustrated). The timing controller may control a driving timing of the gate driver and the data driver. The power supply may provide power to energize the driving circuits of the display panel 300 and the semiconductor chip 10 that is mounted on the semiconductor package 200.

As described above, a semiconductor chip according to example embodiments of the present general inventive concept can include an input portion to input an input signal to circuit elements formed therein. The input portion can include a first input pad formed in a semiconductor substrate and a second input pad spaced apart from the first input pad. The first input pad can be electrically connected to an input wiring of a base film where the semiconductor chip is mounted.

Since the circuit element of the semiconductor chip can be connected to the input wiring through an external connection line, spaces to accommodate inner connection lines may not be required, thus reducing a size of the semiconductor chip. Also, the external connection line may have a relatively low resistance compared to an inner connection line to improve performance characteristics of the semiconductor package including the semiconductor mounted therein.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

All such changes or modifications are intended to be included within the scope of the present general inventive concept as defined in the claims. In the claims, means-plus-function clauses, if used, are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor chip, comprising:
   a semiconductor substrate including a circuit element formed therein;
   an input portion formed on the semiconductor substrate, the input portion including:
   a first input pad to receive an input signal from the outside and a second input pad spaced apart from the first input pad, the second input pad being electrically connected to the first input pad through an external connection line such that the second input pad inputs the input signal to the circuit element, and
   at least one isolated trace formed to be isolated between the first input pad and the second input pad, and end portions of the at least one isolated trace being electrically connected to the first input pad and the second input pad respectively by the external connection line; and
   an output portion formed on the semiconductor substrate and including an output pad to output an output signal from the circuit element.

2. The semiconductor chip of claim 1, wherein the input portion comprises
   a first input pad to receive the input signal;
   a connection pad adjacent to the first input pad and electrically connected to the external connection line; and
   a trace formed in the semiconductor substrate to electrically connect the first input pad and the connection pad to each other.

3. The semiconductor chip of claim 1, wherein an electrostatic discharge (ESD) circuit is electrically connected to the first input pad.

4. The semiconductor chip of claim 3, wherein an ESD circuit is not electrically connected to the second input pad.

5. The semiconductor chip of claim 1, wherein the first input pad is formed in a first peripheral edge portion of the semiconductor substrate and the output pad is formed in a second peripheral edge portion opposite to the first peripheral edge portion.

6. The semiconductor chip of claim 1, wherein the first input pad and the second input pad are arranged along a line extending from the first input pad toward the output pad.

7. The semiconductor chip of claim 1, wherein the semiconductor chip is mounted on a base film and the external connection line is formed to be isolated within a chip-mounted region of the base film.

8. A wiring substrate of a semiconductor package, comprising:
   a base film having a chip-mounted region to mount a semiconductor chip thereon;
   a wiring pattern extending from the chip-mounted region and including an input wiring electrically connected to a first input pad of the semiconductor chip and an output wiring electrically connected to an output pad of the semiconductor chip; and
   at least one connection line formed to be isolated from the wiring pattern within the chip-mounted region to electrically connect the first input pad of the semiconductor chip to a second input pad of the semiconductor chip spaced apart from the first input pad.

9. The wiring substrate of claim 8, wherein a connection end portion of the input wiring is arranged in a first peripheral edge portion of the chip-mounted region and a connection end portion of the output wiring is arranged in a second peripheral edge portion of the chip-mounted region opposite to the first peripheral edge portion.

10. The wiring substrate of claim 8, wherein the connection line is arranged along a line extending from the first input pad toward the output pad.

11. The wiring substrate of claim 8, wherein a connection end portion of the input wiring is arranged in a first peripheral edge portion of the chip-mounted region and a connection end portion of the output wiring is arranged in a third peripheral edge portion of the chip-mounted region adjacent to the first peripheral edge portion.

12. The wiring substrate of claim 11, wherein the connection line comprises a folded portion extending from the first peripheral edge portion toward the third peripheral edge portion.

13. A semiconductor package, comprising:
   a base film;
   a semiconductor chip mounted on a chip-mounted region of the base film and including a first input pad to receive an input signal from the outside, a second input pad spaced apart from the first input pad, and an output pad to output an output signal;
   a wiring pattern extending from the chip-mounted region and including an input wiring electrically connected to the first input pad of the semiconductor chip and an output wiring electrically connected to the output pad of the semiconductor chip; and
   at least one connection line formed to be isolated from the wiring pattern within the chip-mounted region of the base film to electrically connect the first input pad of the semiconductor chip to the second input pad of the semiconductor chip.

14. The semiconductor package of claim 13, wherein the semiconductor chip further comprises
   a connection pad spaced apart from the first input pad and electrically connected to the connection line; and
   a trace to electrically connect the first input pad and the connection pad to each other.

15. The semiconductor package of claim 13, wherein a connection end portion of the input wiring is arranged in a first peripheral edge portion of the chip-mounted region and a connection end portion of the output wiring is arranged in a second peripheral edge portion of the chip-mounted region opposite to the first peripheral edge portion.

16. The semiconductor package of claim 13, wherein the semiconductor chip further comprises at least one isolated trace formed to be isolated between the first input pad and the second input pad, and wherein end portions of the isolated trace are electrically connected to the first input pad and the second input pad respectively by the connection line.

17. The semiconductor package of claim 13, wherein the semiconductor chip comprises an electrostatic discharge (ESD) circuit electrically connected to the first input pad.

18. The semiconductor chip of claim 17, wherein an ESD circuit is not electrically connected to the second input pad.

19. A display device comprising:
   a semiconductor package including:
   a base film, a semiconductor chip mounted on a chip-mounted region of the base film, the semiconductor chip including a first input pad to receive an input signal from the outside, a second input pad spaced apart from the first input pad, and an output pad to output an output signal, input and output wirings extending from the chip-mounted region to be electrically connected to the semiconductor chip, and at least one connection line isolated from the input and output wirings within the chip-mounted region of the base film to electrically connect the first input pad of the semiconductor chip to the second input pad of the semiconductor chip;

a printed circuit board (PCB) electrically connected to the input wiring and disposed in a first end portion of the semiconductor package; and a display panel electrically connected to the output wiring and disposed in a second end portion of the semiconductor package.

20. A semiconductor chip having at least one circuit element formed therein, the semiconductor chip comprising:

a first input portion disposed on a first area of the semiconductor chip to receive an input signal from an external power source;

a second input portion disposed on a second area of the semiconductor chip separate from the first area to receive the input signal via an external connection line from the first input portion, and to input the input signal to the at least one circuit element; and a trace line isolated between the first and second input portions such that end portions of the trace line are electrically connected to the first input portion and the second input portion, respectively, by the external connection line.

21. The semiconductor chip of claim 20, wherein the first and second input portions are electrically isolated from one another on the semiconductor chip when the first and second input portions are disconnected from the external connection line.

22. The semiconductor chip of claim 20, further comprising:

an output portion formed on a third area of the semiconductor chip separate from the first and second areas to output an output signal from the circuit element.

23. The semiconductor chip of claim 20, further comprising:

a base film to mount the semiconductor chip and having the external connection line isolated from the semiconductor chip therein.

* * * * *